(12) United States Patent
Choi et al.

(10) Patent No.: US 8,259,889 B2
(45) Date of Patent: Sep. 4, 2012

(54) APPARATUS AND METHOD FOR FREQUENCY SYNTHESIS USING DELAY LOCKED LOOP

(75) Inventors: Yun-Young Choi, Seongnam-si (KR); Hoon-Tae Kim, Suwon-si (KR)

(73) Assignee: Samsung Electronics co., Ltd., Suwon-si (KR)

( * ) Notice: Subject to any disclaimer, the term of this patent is extended or adjusted under 35 U.S.C. 154(b) by 922 days.

(21) Appl. No.: 12/317,527

(22) Filed: Dec. 23, 2008

(65) Prior Publication Data

US 2009/0168942 A1    Jul. 2, 2009

(30) Foreign Application Priority Data

Dec. 26, 2007  (KR) ........................ 10-2007-0137377

(51) Int. Cl.
*H03D 3/24* (2006.01)
*H03L 7/06* (2006.01)

(52) U.S. Cl. ....................................... 375/376; 327/158

(58) Field of Classification Search .................. 375/316, 375/322, 324, 327, 328, 354, 371, 373, 374, 375/375, 376; 327/141, 147, 156, 158, 149, 327/159, 150, 166; 455/130, 269, 280, 293
See application file for complete search history.

(56) References Cited

U.S. PATENT DOCUMENTS

| | | | |
|---|---|---|---|
| 6,249,192 B1 * | 6/2001 | Gabara et al. | 331/117 R |
| 7,675,332 B1 * | 3/2010 | Kwasniewski et al. | 327/158 |
| 2007/0002993 A1 | 1/2007 | Wang et al. | |
| 2007/0030041 A1 * | 2/2007 | Huang et al. | 327/158 |
| 2007/0057708 A1 * | 3/2007 | Uehara et al. | 327/156 |
| 2007/0176656 A1 | 8/2007 | Lesso | |
| 2007/0274425 A1 * | 11/2007 | Werker | 375/376 |
| 2008/0069183 A1 * | 3/2008 | Terada | 375/137 |
| 2008/0129343 A1 * | 6/2008 | Kenney et al. | 327/12 |

FOREIGN PATENT DOCUMENTS

WO    WO 2006033518 A1 *   3/2006

* cited by examiner

*Primary Examiner* — David C. Payne
*Assistant Examiner* — Vineeta Panwalkar

(57) ABSTRACT

An apparatus and method for frequency synthesis using a Delay Locked Loop (DLL) are provided. The apparatus includes the DLL, an edge pulse generator, and an inductive-capacitive (LC) tank switch. If phases of a reference frequency signal and a feedback signal are the same and thus are locked, the DLL delays the reference frequency signal. The edge pulse generator generates a plurality of pulse signals representing phase delay amounts of signals. The LC tank switch combines the plurality of pulse signals and generates frequency.

16 Claims, 9 Drawing Sheets

APPARATUS AND METHOD FOR FREQUENCY SYNTHESIS USING DELAY LOCKED LOOP

CROSS-REFERENCE TO RELATED APPLICATION(S) AND CLAIM OF PRIORITY

The present application claims priority under 35 U.S.C. §119(a) to a Korean Patent Application filed in the Korean Intellectual Property Office on Dec. 26, 2007 and assigned Serial No. 10-2007-0137377, the contents of which are herein incorporated by reference.

TECHNICAL FIELD OF THE INVENTION

The present invention relates generally to an apparatus and method for frequency synthesis. More particularly, the present invention relates to an apparatus and method for generating a high frequency signal using a Delay Locked Loop (DLL) having excellent noise characteristic.

BACKGROUND OF THE INVENTION

At present, the global mainstream of a mobile communication environment is $2^{nd}$ Generation (2G) digital systems supporting various multi modes. The $3^{rd}$ Generation (3G) broadband International Mobile Telecommunications-2000 (IMT-2000) standard having sought single standardization for a global roaming service is mainly divided into North American $3^{rd}$ Generation Partnership Project 2 (3GPP2) Code Division Multiple Access 2000 (CDMA2000) and European/Japanese $3^{rd}$ Generation Partnership Project (3GPP) Wideband Code Division Multiple Access (W-CDMA) systems having different characteristics and is scheduled for local commercialization. Accordingly, a single chip technology based on a Complementary Metal-Oxide Semiconductor (CMOS) has been developed in recent years. Thus, a local oscillator available at several frequency bands is required and thus, its technological development is under way.

In order to generate high band frequency, the conventional art uses a Phase Locked Loop (PLL) local oscillator including a Voltage Controlled Oscillator (VCO) 101, a Phase Frequency Detector (PFD) 103, and a filter 105 as shown in FIG. 1. However, the PLL local oscillator has a disadvantage in that it is difficult to improve a noise characteristic because of a technological limitation of the PLL.

In recent years, a demand for a local oscillator having a better noise characteristic for application of various systems has been made. Accordingly, as shown in FIG. 2, various methods for generating high frequency using Delay Locked Loops (DLLs) 201 and 211 have been proposed. As shown in FIG. 2, at each transmit/receive end, a conventional communication system generates a reference frequency signal for converting a radio frequency (RF) signal into an intermediate frequency (IF) signal or converting an IF signal into an RF signal using the DLLs 201 and 211 and VCOs 203 and 213. The DLLs 201 and 211 delay a phase of an input signal. The VCOs 203 and 213 control oscillation frequencies through voltage control.

For example, a method for generating a desired frequency by selecting each of delay cells 311, 313, 315, and 317 within a DLL 300 through a multiplexer 301 as shown in FIG. 3, and a method (not shown) for generating various frequencies by installing two decoders for selecting a pulse and a part for making a fractional number in a part for selecting a delay cell within a DLL have been proposed.

However, in the method for generating a desired frequency by switching the delay cells (i.e., buffers) 311, 313, 315, and 317 using the multiplexer 301 as shown in FIG. 3, there is a problem in that a layout area is increased because of a need to use more buffers to generate various frequencies, and the noise characteristic deteriorates as the number of buffers increases due to a noise generated at each buffer.

In the method for generating various frequencies by installing the two decoders and the part for making a fractional number, because the frequency generated by switching each buffer is dependent on a delay time of each buffer, a randomization of a constant period is required to generate a frequency of a fractional multiple not an integer multiple of a desired frequency. Accordingly, this method can generate each frequency of a fractional multiple, but has a problem in that repeated switching causes the generation of a noise, thus deteriorating the entire noise characteristic.

SUMMARY OF THE INVENTION

To address the above-discussed deficiencies of the prior art, it is a primary aspect of the present invention to substantially solve at least the above problems and/or disadvantages and to provide at least the advantages below. Accordingly, one aspect of the present invention is to provide an apparatus and method for frequency synthesis using a Delay Locked Loop (DLL).

Another aspect of the present invention is to provide an apparatus and method for frequency synthesis with a good noise characteristic using a DLL.

A further aspect of the present invention is to provide an apparatus and method for frequency synthesis, for generating, as a pulse, each phase delay amount generated from each of delay cells within a DLL and then summing up generated pulses, thus generating frequency.

The above aspects are achieved by providing an apparatus and method for frequency synthesis using a DLL.

According to one aspect of the present invention, an apparatus for frequency synthesis using a Delay Locked Loop (DLL) is provided. The apparatus includes the DLL, an edge pulse generator, and an inductive-capacitive (LC) tank switch. If phases of a reference frequency signal and a feedback signal are the same and thus are locked, the DLL delays the reference frequency signal using a plurality of buffers and provides an output of each of the plurality of buffers to the edge pulse generator. The edge pulse generator generates a plurality of pulse signals representing phase delay amounts of signals, which are each output from the plurality of buffers, using edge information of the signals. The LC tank switch combines the plurality of pulse signals through a plurality of transistors and generates frequency.

According to another aspect of the present invention, a method for generating frequency using a Delay Locked Loop (DLL) is provided. The method includes, if phases of a reference frequency signal and a feedback signal are the same and thus are locked, delaying the reference frequency signal using a plurality of buffers, generating a plurality of pulse signals representing phase delay amounts of signals each output from the plurality of buffers using edge information of the signals, and combining the plurality of pulse signals through a plurality of transistors and generating frequency.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF EXEMPLARY EMBODIMENTS

FIGS. 4 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

In the following, an exemplary embodiment of the present invention provides a frequency synthesis apparatus and method for generating, as a pulse signal, each phase delay amount from each of delay cells included in a Delay Locked Loop (DLL) and then generating frequency through a switching operation of a transistor depending on the generated pulse signal.

Figure 1:
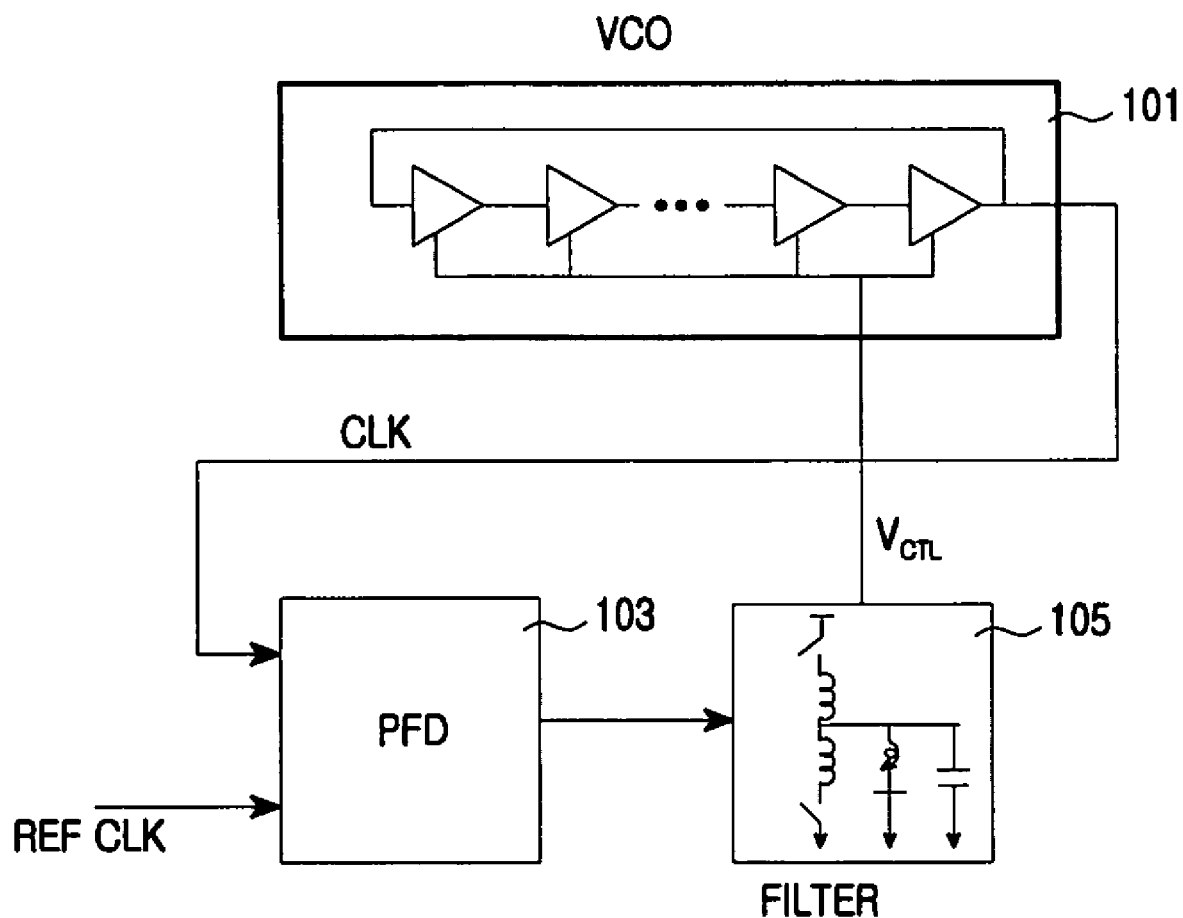
FIG. 1 is a diagram illustrating a construction of a Phase Locked Loop (PLL) according to the conventional art.
Figure 2:
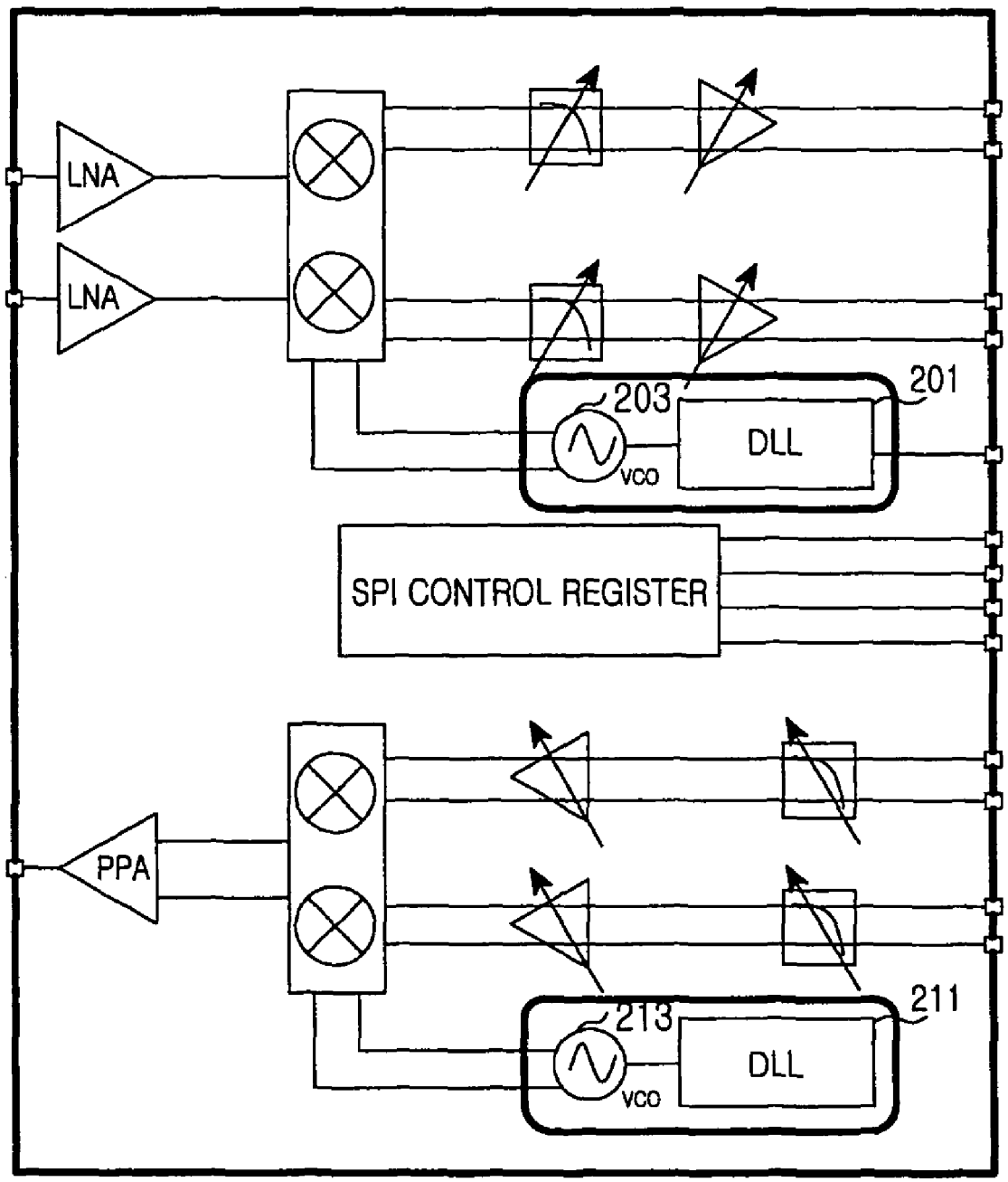
FIG. 2 is a diagram illustrating a construction of a local oscillator using a Delay Locked Loop (DLL) according to the conventional art.
Figure 3:
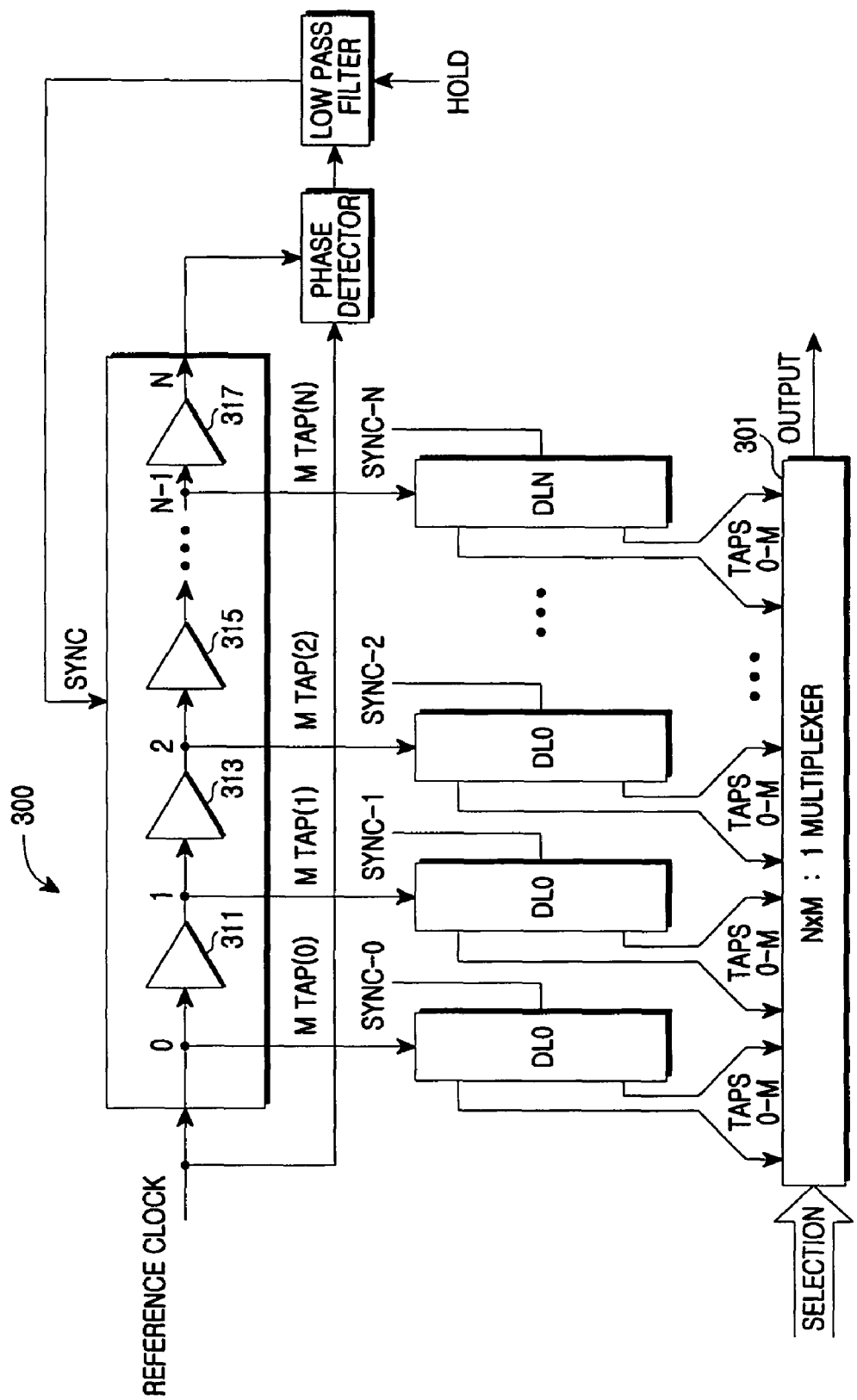
FIG. 3 is a diagram illustrating a frequency synthesizer for generating frequency using a DLL according to the conventional art.
Figure 4:
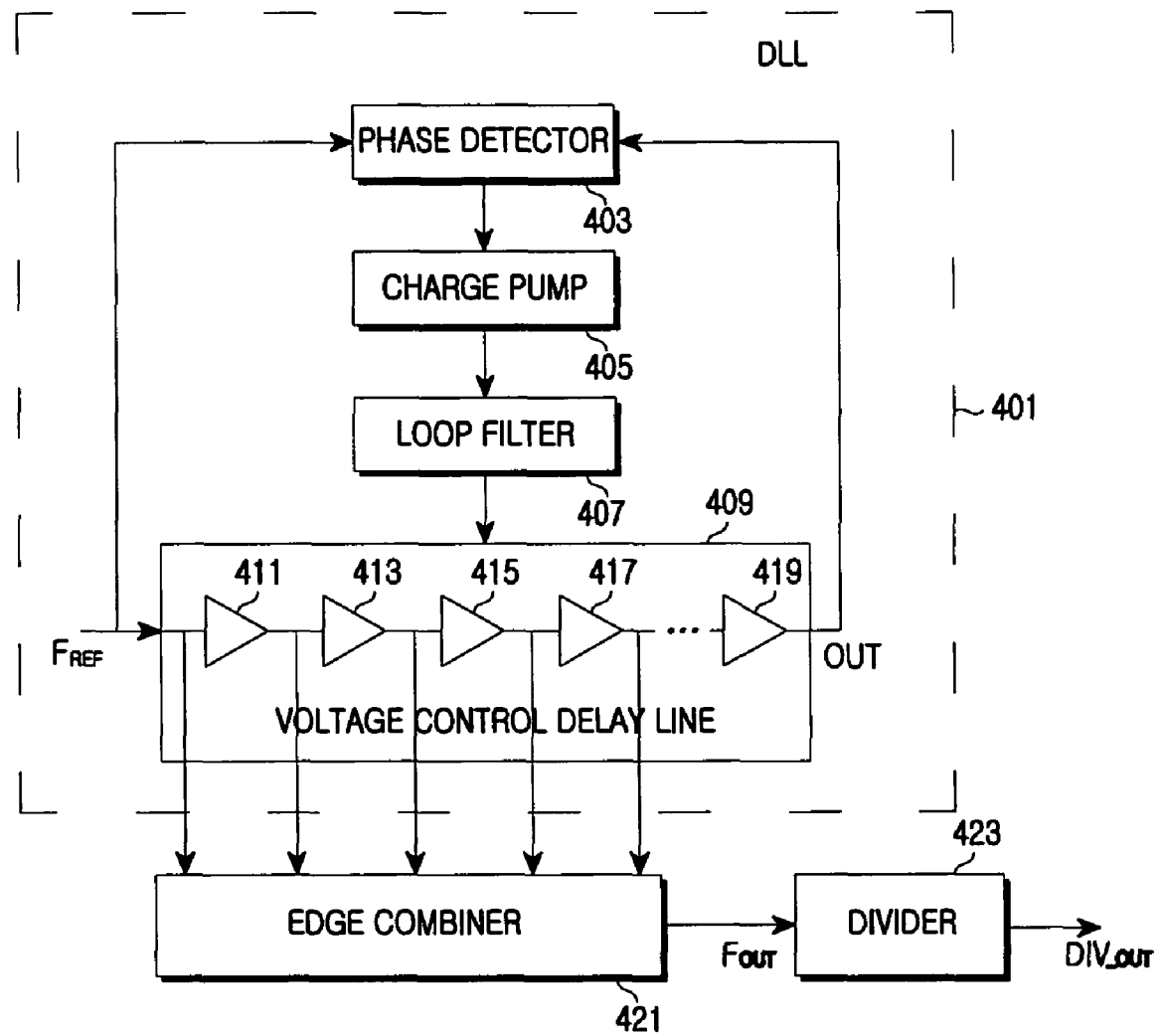
FIG. 4 is a block diagram illustrating a construction of a frequency synthesizer for generating frequency using a DLL according to an exemplary embodiment of the present invention.

FIG. 4 is a block diagram illustrating a construction of a frequency synthesizer for generating frequency using a DLL according to an exemplary embodiment of the present invention.

Referring to FIG. 4, the frequency synthesizer includes a DLL 401, an edge combiner 421, and a divider 423. The DLL 401 includes a phase detector 403, a charge pump 405, a loop filter 407, and a voltage control delay line 409. The voltage control delay line 409 includes a plurality of buffers 411, 413, 415, 417, and 419.

The DLL 401 includes the phase detector 403, the charge pump 405, the loop filter 407, and the voltage control delay line 409 and thus delays a phase of a reference frequency signal by a predetermined value.

The phase detector 403 measures a phase difference between a reference frequency signal ($F_{REF}$) input and a feedback signal that is output from the voltage control delay line 409, and outputs a clock signal representing the measured phase difference. If the reference frequency signal ($F_{REF}$) and the feedback signal are in the same phase, the phase detector 403 locks the DLL 401.

The charge pump 405 analyzes a pulse width of the clock signal representing the phase difference, converts the phase difference into a corresponding current, and provides the current to the loop filter 407. The loop filter 407 low-pass filters the current and provides a control voltage to the voltage control delay line 409.

The voltage control delay line 409 includes the plurality of buffers 411, 413, 415, 417, and 419 and thus, delays an input reference frequency signal ($F_{REF}$) by an amount of time corresponding to the control voltage that is output from the loop filter 407. If the phase detector 403 locks the DLL 401, a reference frequency signal ($F_{REF}$) input to the voltage control delay line 409 is phase delayed by a predetermined value as the signal passes through each of the buffers 411, 413, 415, 417, and 419. If the reference frequency signal ($F_{REF}$) passes through the final buffer 419, its phase is delayed by 360 degrees whereby a frequency signal having the same phase as a first input reference frequency signal is output.

In particular, signals phase delayed and output by the respective buffers 411, 413, 415, 417, and 419 of the voltage control delay line 409 are provided to the edge combiner 421 according to an exemplary embodiment of the present invention.

Figure 5:
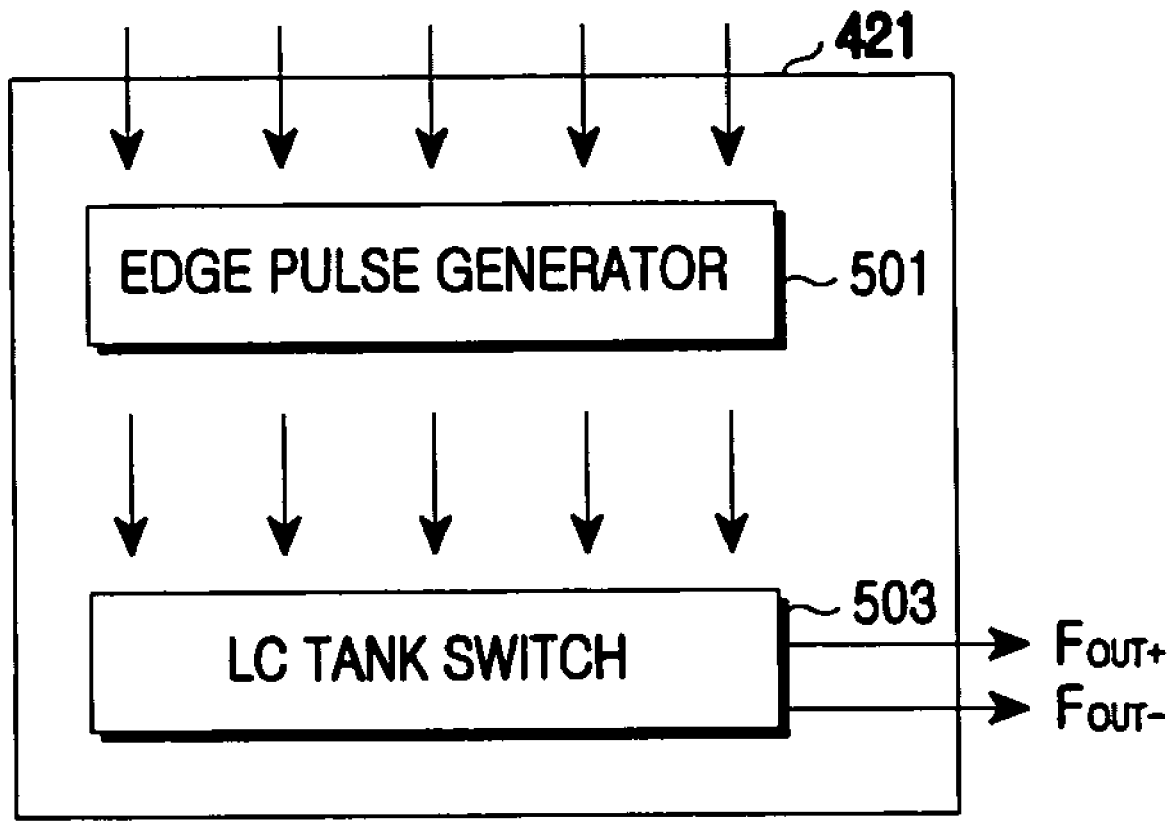
FIG. 5 is a detailed block diagram illustrating a construction of an edge combiner according to an exemplary embodiment of the present invention.

The edge combiner 421 generates a high frequency band signal by taking phase delay signals provided by each of the buffers 411, 413, 415, 417, and 419 of the voltage control delay line 409. That is, as shown in FIG. 5, the edge combiner 421 includes an edge pulse generator 501 and an inductive-capacitive (LC) tank switch 503 and thus, receives the phase delay signals and generates a high frequency band signal. The edge combiner 421 is described below in detail with reference to FIGS. 5 and 6.

The divider 423 divides a high frequency band signal ($F_{OUT}$) received from the edge combiner 421 at a preset ratio and outputs a desired band frequency ($DIV\_{OUT}$).

FIG. 5 is a detailed block diagram illustrating a construction of an edge combiner according to an exemplary embodiment of the present invention.

Referring to FIG. 5, the edge combiner 421 includes an edge pulse generator 501 and an LC tank switch 503.

Figure 6A:
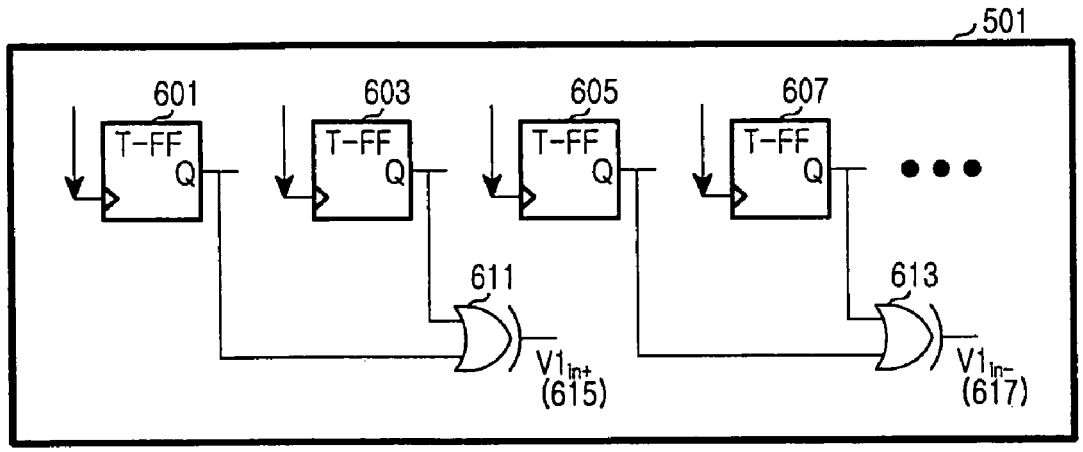
FIGS. 6A and 6B are detailed block diagrams illustrating constructions of an edge pulse generator and an inductive-capacitive (LC) tank switch according to an exemplary embodiment of the present invention.

The edge pulse generator 501 generates, as a pulse, a phase delay amount of each signal that is input in the respective buffers 411, 413, 415, 417, and 419 of the voltage control delay line 409, using edge information of each of the signals. Using only rising edge or falling edge information of each of the signals, as shown in FIG. 6A, the edge pulse generator 501 includes T flip-flops 601, 603, 605, and 607 of number corresponding to the number of the buffers 411, 413, 415, 417, and 419, and includes exclusive OR gates 611 and 613 for generating a phase delay amount of each signal as a pulse by executing exclusive logical sum operations of the outputs of the T flip-flops 601, 603, 605, and 607.

In other words, the plurality of T flip-flops 601, 603, 605, and 607 each generate outputs corresponding always to rising edges or falling edges of input signals, and the exclusive OR gates 611 and 613 each execute exclusive logical sum operations on the outputs from the corresponding T flip-flops 601, 603, 605, and 607. Upon execution of the exclusive logical sum operation, the edge pulse generator 501 generates a phase delay amount of each of the signals as a pulse. That is, as shown in FIG. 7, an edge pulse generator 723 within an edge combiner 721 generates, as pulses, phase delay amounts of signals that are each output from buffers 701, 703, 705, 707, and 709 of a voltage control delay line 700.

Figure 6B:
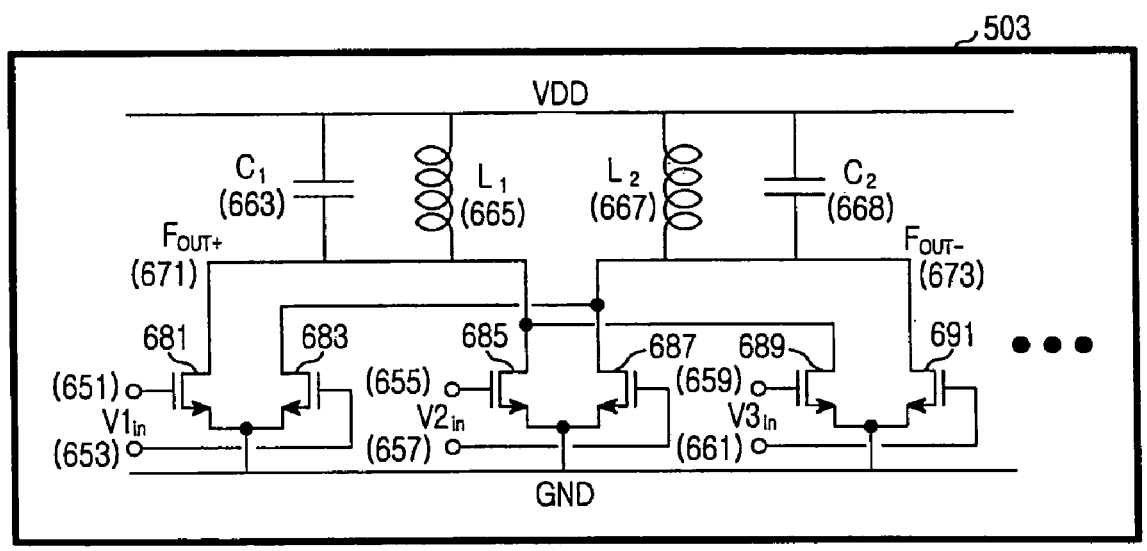

The LC tank switch 503 generates frequency corresponding to as much as a sum of all pulses by summing up respective pulses output from the edge pulse generator 501. As shown in FIG. 6B, the LC tank switch 503 includes a plurality of transistors 681, 683, 685, 687, 689, and 691 and oscillates frequency corresponding to as much as a sum of all pulse signals that are input through switching operations of the transistors 681, 683, 685, 687, 689, and 691. The transistors 681, 683, 685, 687, 689, and 691 have gates 651, 653, 655, 657, 659, and 661 each connecting with the corresponding exclusive OR gates included in the edge pulse generator 501 to receive pulse signals, have drains connecting with a voltage source (VDD), and have sources connecting with the ground (GND).

For example, pulse signals ($V1_{in+}$) 615 and ($V1_{in-}$) 617 output from the exclusive OR gates 611 and 613 are input to the gates ($V1_{in}$) 651 and 653 of the corresponding transistors 681 and 683. Upon receiving the pulse signals ($V1_{in+}$) 615 and ($V1_{in-}$) 617, the corresponding transistors 681 and 683 repeatedly perform switching operations while being synchronized to phases of the corresponding pulses, thus causing a delay. As such, frequencies of a sum of all pulses generated by delay amounts and input to the respective transistors are generated at an $F_{OUT+}$ end 671 and an $F_{OUT-}$ end 673. Here, a phase difference between the frequencies generated at the $F_{OUT+}$ and $F_{OUT-}$ ends 671 and 673 is equal to 180 degrees. By connecting capacitors (C1) 663 and (C2) 668 with inductors (L1) 665 and (L2) 667 in parallel between the drains of the plurality of transistors 681, 683, 685, 687, 689, and 691 and the voltage source (VDD), a noise of a pulse signal generated through a switching operation of each of the transistors 681, 683, 685, 687, 689, and 691 is eliminated.

Figure 7:
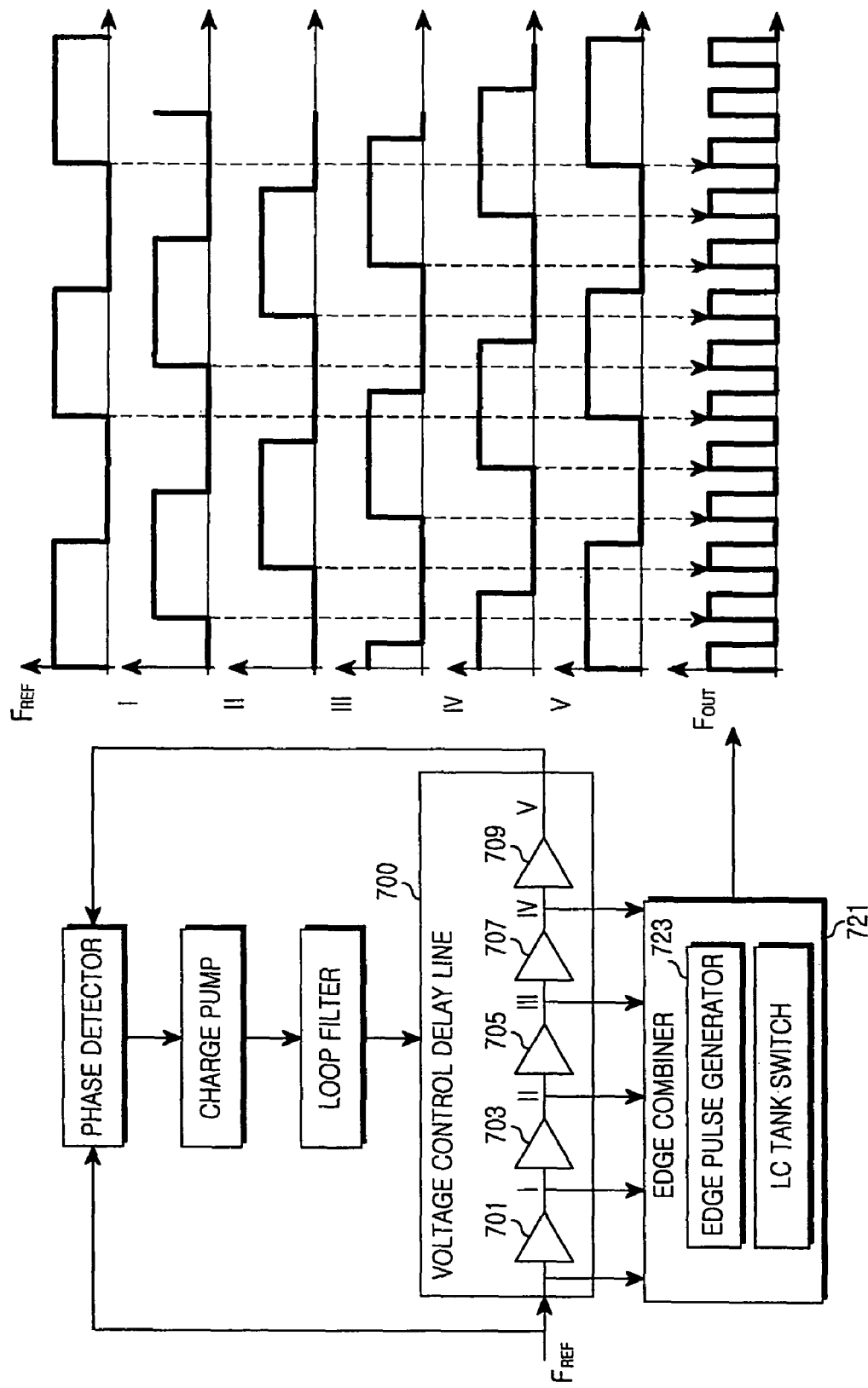
FIG. 7 is a diagram illustrating a clock pulse generated from a frequency synthesizer according to an exemplary embodiment of the present invention.

That is, as shown in FIG. 7, an LC tank switch generates frequency ($F_{OUT}$) having the same pulse as a sum of all pulses (I, II, III, IV, and V) that are generated through an edge pulse generator 723 within an edge combiner 721.

Figure 8:
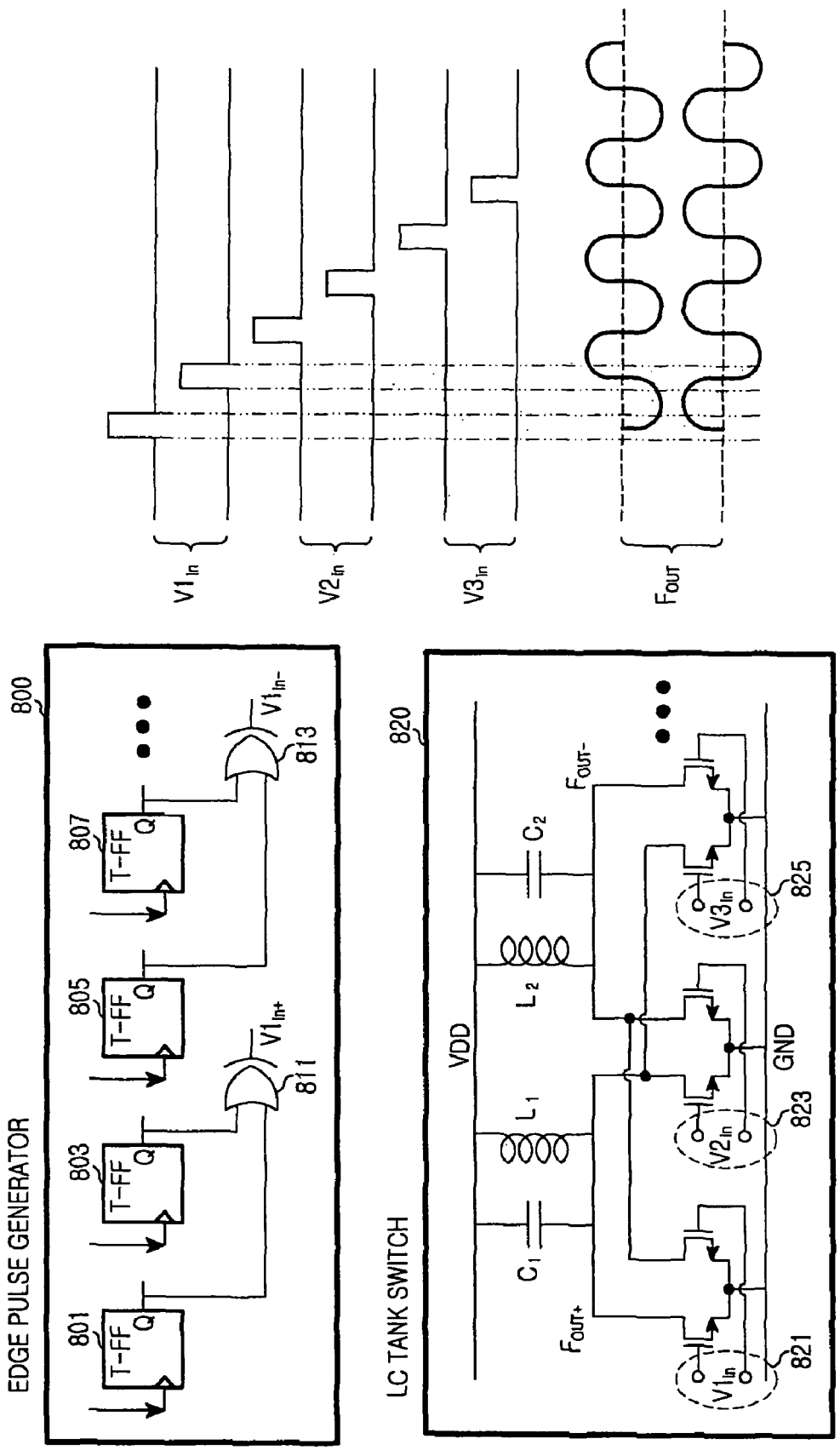
FIG. 8 is a diagram illustrating a clock pulse generated from an edge combiner of a frequency synthesizer according to an exemplary embodiment of the present invention.

A clock signal output depending on operations of an edge pulse generator 800 and an LC tank switch 820 is described with reference to FIG. 8.

Upon receiving a phase delay signal from each of the buffers 411, 413, 415, 417, and 419 of the voltage control delay line 409, the edge pulse generator 800 outputs a pulse signal representing a phase delay amount of each signal by detecting edge information (rising edge or falling edge information) of a phase delay signal input through T flip-flops 801, 803, 805, and 807 and then executing an exclusive logical sum operation of the detected edge information using exclusive OR gates 811 and 813.

The LC tank switch 820 receives pulse signals from the corresponding exclusive OR gates 811 and 813 through gates ($V1_{in}$) 821, ($V2_{in}$) 823, and ($V3_{in}$) 825 of respective transistors, sums up the respective pulse signals, and generates corresponding frequencies through ends ($F_{OUT+}$) and ($F_{OUT-}$).

Figure 9:
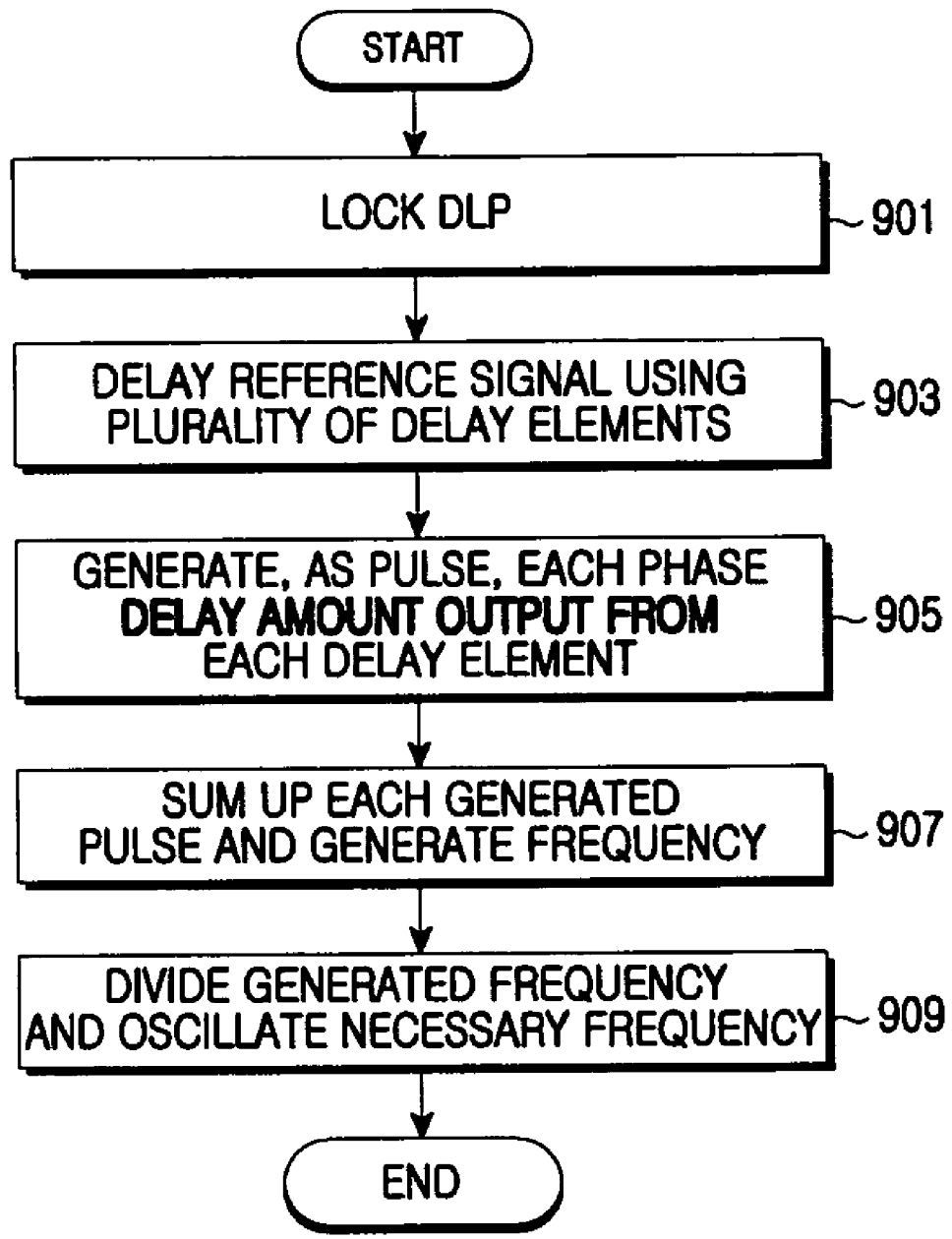
FIG. 9 is a flow diagram illustrating a process of generating frequency in a frequency synthesizer according to an exemplary embodiment of the present invention.

FIG. 9 is a flow diagram illustrating a process of generating frequency in a frequency synthesizer according to an exemplary embodiment of the present invention.

Referring to FIG. 9, in step 901, the frequency synthesizer compares phases of a reference frequency signal and a feedback signal through a phase detector, and locks a DLL if the phases of the two signals are the same.

If the DLL is locked, in step 903, the frequency synthesizer delays the reference frequency signal using a plurality of delay elements (i.e., delay buffers) within the DLL.

Then, in step 905, the frequency synthesizer generates a pulse signal representing a phase delay amount of each signal, by detecting edge information (a rising edge or falling edge) of a signal output from each delay element using a T flip-flop and executing an exclusive logical sum operation on the detected edge information using an exclusive OR gate.

After that, in step 907, the frequency synthesizer generates a frequency signal corresponding to a sum of all pulse signals, by inputting the pulse signals to gates of respective transistors and enabling switching operations of the transistors.

Then, in step 909, the frequency synthesizer divides the generated frequency at a preset ratio using a divider, thus generating a desired frequency. After that, the frequency synthesizer terminates the process according to an exemplary embodiment of the present invention.

An exemplary embodiment of the present invention has an effect of providing an excellent noise characteristic using a minimal buffer, by generating a high frequency through a phase delay amount generated from each of delay cells included in a DLL as a pulse and then summing up all pulses generated through switching operations of transistors. Also, it has an effect of providing excellent noise characteristic, by eliminating noise caused by a switching operation through an inductor and a capacitor.

While the invention has been shown and described with reference to certain preferred embodiments thereof, it will be understood by those skilled in the art that various changes in form and details may be made therein without departing from the spirit and scope of the invention as defined by the appended claims.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for frequency synthesis using a Delay Locked Loop (DLL), the apparatus comprising:
   the Delay Locked Loop for, if phases of a reference frequency signal and a feedback signal are the same and thus are locked, delaying the reference frequency signal using a plurality of buffers and providing an output of each of the plurality of buffers to an edge pulse generator;
   the edge pulse generator for generating a plurality of pulse signals representing phase delay amounts of signals, which are each output from the plurality of buffers, using edge information of the signals; and
   an inductive-capacitive (LC) tank switch for combining the plurality of pulse signals through a plurality of transistors and generating a frequency,
   wherein the edge pulse generator comprises:
   a plurality of T flip-flops for, upon receipt of rising edges or falling edges of the signals output from the plurality of buffers, outputting values corresponding to the rising edges or falling edges; and a plurality of exclusive OR gates for executing exclusive logical sum operations on outputs from two of the plurality of T flip-flops and generating pulse signals representing phase delay amounts.

2. The apparatus of claim 1, further comprising a divider for dividing the frequency generated by the LC tank switch, at a preset ratio.

3. The apparatus of claim 1, wherein the LC tank switch comprises a plurality of transistors having drains connecting to a voltage source (VDD) and sources connecting to a ground (GND), and receiving pulse signals from the edge pulse generator through gates and executing switching operations depending on the received pulse signals.

4. The apparatus of claim 3, wherein the LC tank switch further comprises a capacitor and an inductor connected in parallel between the drains of the plurality of transistors and the voltage source (VDD) and eliminating a noise of the pulse signal generated through the switching operation of the transistor.

5. A method for generating frequency using a Delay Locked Loop (DLL), the method comprising:
if phases of a reference frequency signal and a feedback signal are the same and thus are locked, delaying the reference frequency signal using a plurality of buffers;
generating a plurality of pulse signals representing phase delay amounts of signals output from the plurality of buffers, using edge information of the signals; and
combining the plurality of pulse signals through a plurality of transistors and generating a frequency,
wherein generating the plurality of pulse signals comprises:
upon receipt of rising edges or falling edges of the signals output from the plurality of buffers using T flip-flops, outputting values corresponding to the rising edges or falling edges; and
executing an exclusive logical sum operation on two values, which are output corresponding to the rising edges or falling edges, using an exclusive OR gate, and generating a pulse signal representing a phase delay amount.

6. The method of claim 5, further comprising dividing the generated frequency at a preset ratio.

7. The method of claim 5, wherein generating the frequency comprises executing switching operations depending on the pulse signals by the plurality of transistors having drains connected to a voltage source (VDD), sources connected to a ground (GND), and gates for receiving the pulse signals, and generating a frequency corresponding to a combination of the plurality of pulses.

8. The method of claim 7, wherein generating the frequency further comprises eliminating a noise of the pulse signal generated through the switching operation of the transistor, using a capacitor and an inductor that are connected in parallel between the drains of the plurality of transistors and the voltage source (VDD).

9. A transmitter/receiver apparatus for synthesizing frequency using a Delay Locked Loop (DLL) in a communication system, the apparatus comprising:
the Delay Locked Loop for, if phases of a reference frequency signal and a feedback signal are the same and thus are locked, delaying the reference frequency signal using a plurality of buffers;
an edge combiner for generating a plurality of pulse signals representing phase delay amounts using edge information of signals output from the plurality of buffers, combining the pulse signals, and generating a frequency; and
a mixer for converting a frequency band of an input signal using the generated frequency,
wherein the edge combiner comprises:
a plurality of T flip-flops for, upon receipt of rising edges or falling edges of signals output from the plurality of buffers, outputting values corresponding to the rising edges or falling edges; and
a plurality of exclusive OR gates for executing exclusive logical sum operations on outputs from two of the plurality of T flip-flops and generating pulse signals representing phase delay amounts.

10. The apparatus of claim 9, further comprising a divider for dividing the frequency generated by the edge combiner, at a preset ratio.

11. The apparatus of claim 9, wherein the edge combiner comprises a plurality of transistors having drains connecting to a voltage source (VDD) and sources connecting to a ground (GND), and receiving the generated plurality of pulse signals through gates and executing switching operations depending on the received pulse signals.

12. The apparatus of claim 11, wherein the edge combiner further comprises a capacitor and an inductor connected in parallel between the drains of the plurality of transistors and the voltage source (VDD) and eliminating a noise of the pulse signal generated through the switching operation of the transistor.

13. A method of a transmitter/receiver for synthesizing frequency using a Delay Locked Loop (DLL) in a communication system, the method comprising:
if phases of a reference frequency signal and a feedback signal are the same and thus are locked, delaying the reference frequency signal using a plurality of buffers;
generating a plurality of pulse signals representing phase delay amounts of signals output from the plurality of buffers, using edge information of the signals;
combining the plurality of pulse signals through a plurality of transistors and generating a frequency; and
converting a frequency band of an input signal using the generated frequency,
wherein generating the plurality of pulse signals comprises:
upon receipt of rising edges or falling edges of signals output from the plurality of buffers using T flip-flops, outputting values corresponding to the rising edges or falling edges; and
executing an exclusive logical sum operation on two values that are output corresponding to the rising edges or falling edges using an exclusive OR gate, and generating a pulse signal representing a phase delay amount.

14. The method of claim 13, further comprising dividing the generated frequency at a preset ratio.

15. The method of claim 13, wherein generating the frequency comprises executing switching operations depending on the pulse signals by the plurality of transistors having drains connected to a voltage source (VDD), sources connected to a ground (GND), and gates for receiving the pulse signals, and generating a frequency corresponding to a combination of the plurality of pulses.

16. The method of claim 15, wherein generating the frequency further comprises eliminating a noise of the pulse signal generated through the switching operation of the transistor, using a capacitor and an inductor connected in parallel between the drains of the plurality of transistors and the voltage source (VDD).

* * * * *